United States Patent
Kim

(10) Patent No.: US 9,478,718 B2
(45) Date of Patent: Oct. 25, 2016

(54) LIGHT EMITTING DEVICE

(71) Applicant: LG INNOTEK CO., LTD., Seoul (KR)

(72) Inventor: Dong Ha Kim, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 13 days.

(21) Appl. No.: 13/973,206

(22) Filed: Aug. 22, 2013

(65) Prior Publication Data

US 2014/0054633 A1 Feb. 27, 2014

(30) Foreign Application Priority Data

Aug. 24, 2012 (KR) .................. 10-2012-0093016

(51) Int. Cl.

| H01L 33/00 | (2010.01) |
|---|---|
| H01L 33/58 | (2010.01) |
| H01L 33/14 | (2010.01) |
| H01L 33/38 | (2010.01) |
| H01L 33/40 | (2010.01) |
| H01L 33/42 | (2010.01) |

(52) U.S. Cl.
CPC .............. *H01L 33/58* (2013.01); *H01L 33/145* (2013.01); *H01L 33/38* (2013.01); *H01L 33/405* (2013.01); *H01L 33/42* (2013.01); *H01L 2224/13* (2013.01)

(58) Field of Classification Search
CPC . H01L 25/0753; H01L 33/62; H01L 27/153; H01L 33/504; H01L 33/32; H01L 33/08; H01L 25/0756; H01L 27/15; B82Y 20/00
USPC .................... 257/88–103, 431–442
See application file for complete search history.

(56) References Cited

U.S. PATENT DOCUMENTS

| 2002/0187356 A1* | 12/2002 | Weeks, Jr. ............. C30B 23/02 428/446 |
| 2003/0094664 A1* | 5/2003 | Yagi ....................... G01J 1/429 257/431 |
| 2004/0201110 A1 | 10/2004 | Venugopalan et al. |
| 2011/0068360 A1* | 3/2011 | Nago ..................... H01L 33/32 257/98 |
| 2011/0237057 A1* | 9/2011 | Prelas .................... C09K 11/64 438/558 |
| 2013/0292685 A1* | 11/2013 | Jiang .................. H01L 31/0304 257/76 |

FOREIGN PATENT DOCUMENTS

| EP | 2 339 651 A2 | 6/2011 | |
| JP | 11-251684 | * 7/1999 | ............... H01S 3/18 |
| KR | 10-2012-0051205 A | 5/2012 | |
| WO | WO2010116422 | * 10/2010 | ....................... 349/61 |

OTHER PUBLICATIONS

European Search Report dated Dec. 14, 2015 issued in Application No. 13181618.3.

* cited by examiner

*Primary Examiner* — Cuong Q Nguyen
*Assistant Examiner* — Nishath Yasmeen
(74) *Attorney, Agent, or Firm* — Ked & Associates, LLP

(57) ABSTRACT

A light emitting device includes a substrate and a light emitting structure including a first conductive type semiconductor layer, an active layer and a second conductive type semiconductor layer provided in a first direction on the substrate. A first electrode layer is provided over the first conductive type semiconductor layer, and a second electrode layer is provided in a second direction over the second conductive type semiconductor layer. The second electrode layer has an energy band gap wider than an energy band gap of the active layer.

15 Claims, 16 Drawing Sheets

124  126  134A 124  126  134A

LIGHT EMITTING DEVICE

CROSS REFERENCE TO RELATED APPLICATION

This application claims priority under 35 U.S.C. §119 to Korean Patent Application No. 10-2012-0093016, filed in Korea on 24 Aug. 2012, which is hereby incorporated in its entirety by reference as if fully set forth herein.

TECHNICAL FIELD

Embodiments relate to a light emitting device.

BACKGROUND

Light emitting diodes (LEDs) are semiconductor devices which send and receive a signal by converting electricity into infrared light or visible light using characteristics of compound semiconductors or which are used as light sources.

Group III-V nitride semiconductors have received substantial attention as essential materials for light emitting devices such as light emitting diodes (LEDs) or laser diodes (LDs) due to physical and chemical properties thereof.

Such a light emitting diode does not contain environmentally harmful substances such as mercury (Hg) used in conventional lighting apparatuses such as incandescent lamps or fluorescent lamps and thus advantageously has superior eco-friendliness, long lifespan and low power consumption, thus serving as an alternative to conventional light sources.

FIG. 1 is a sectional view illustrating a conventional light emitting device.

Referring to FIG. 1, the light emitting device includes a substrate 10, an AlN layer 12, an n-type AlGaN layer 22, a multi quantum well (MQW) layer 24, a p-type AlGaN layer 26 and a p-type GaN layer 28. The MQW layer 24 emits light having an energy determined by an inherent energy band of a material constituting an active layer 24, based on recombination between holes injected through the p-type AlGaN layer 26 and electrons injected through the n-type AlGaN layer 22. The p-type GaN layer 28 is a portion of a p-type electrode, which is made of GaN.

In such a conventional light emitting device, among light emitted from the MQW layer 24, light directed toward the p-type GaN layer 28 is absorbed in the p-type GaN layer 28 and thus does not contribute to light emission of the light emitting device. Accordingly, there is a demand for a solution to this problem.

The above references are incorporated by reference herein where appropriate for appropriate teachings of additional or alternative details, features and/or technical background.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1:
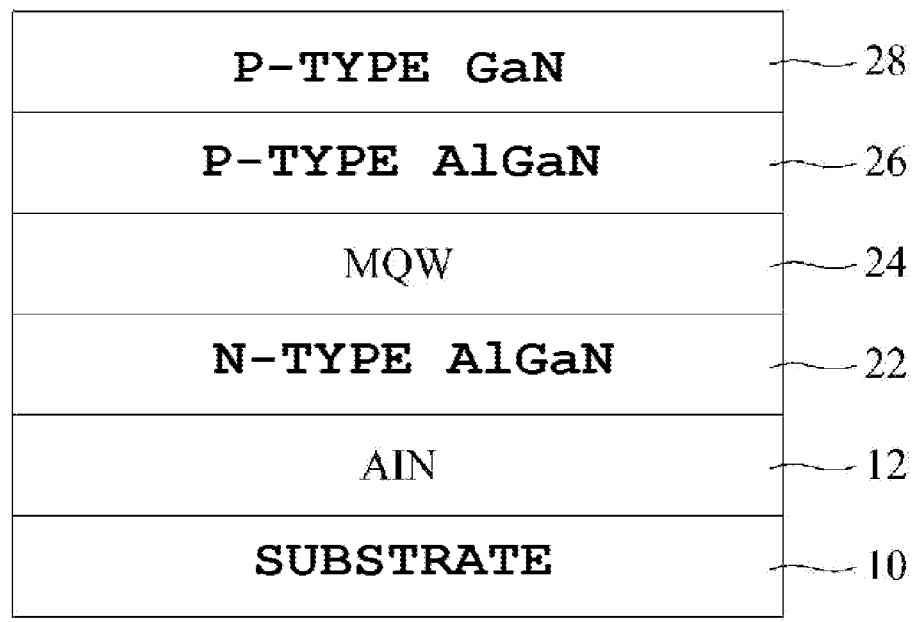
FIG. 1 is a sectional view illustrating a conventional light emitting device.

Hereinafter, embodiments will be described with reference to the annexed drawings.

It will be understood that when an element is referred to as being "on" or "under" another element, it can be directly on/under the element, and one or more intervening elements may also be present. When an element is referred to as being 'on' or 'under', 'under the element' as well as 'on the element' can be included based on the element.

In the drawings, the thickness or size of each layer is exaggerated, omitted, or schematically illustrated for convenience of description and clarity. The size or area of each constituent element does not entirely reflect the actual size thereof.

Figure 2:
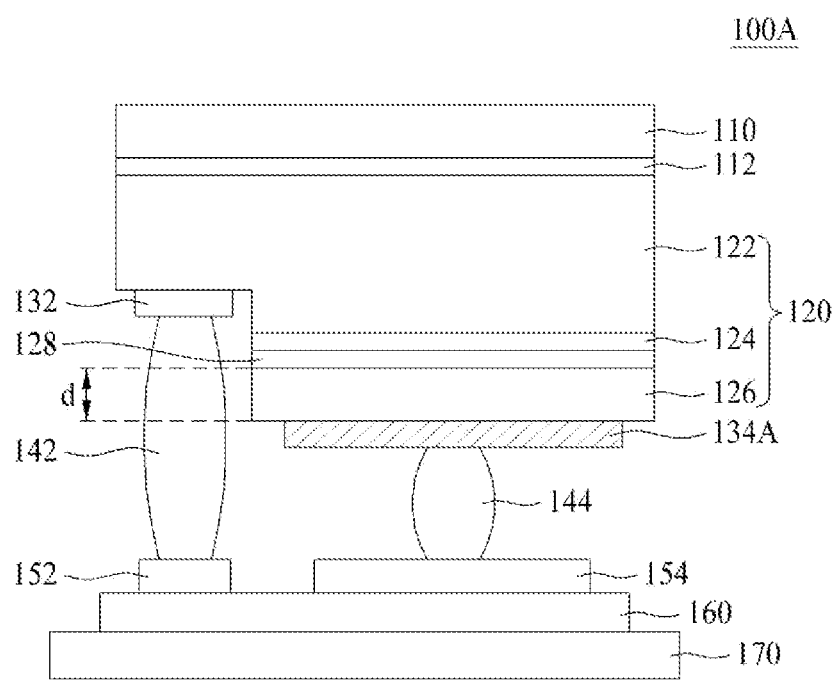
FIG. 2 is a sectional view illustrating a light emitting device according to one embodiment.

FIG. 2 is a sectional view illustrating a light emitting device 100A according to one embodiment.

The light emitting device 100A includes a substrate 110, a buffer layer 112, a light emitting structure 120, first and second electrode layers 132 and 134A, first and second bumps 142 and 144, first and second electrode pads 152 and 154, a passivation layer 160 and a submount 170.

The light emitting device 100A includes an LED including a plurality of compound semiconductor layers, for example, Group III-V element compound semiconductor layers, and the LED may be a color LED emitting, for example, blue light, green light or red light, an ultraviolet (UV) LED, a deep ultraviolet LED or a non-polarized LED. Light emitted from the LED may be obtained using various semiconductors, but the disclosure is not limited thereto.

In the light emitting device 100A having a flip bonding structure illustrated in FIG. 2, the first and second electrode layers 132 and 134A are disposed by a flip method on the submount 170. Namely, the first electrode layer 132 is connected to the first electrode pad 152 of the submount 170 using the first bump 142 and the second electrode layer 134A is connected to the second electrode pad 154 of the submount 170 using the second bump 144.

For example, the submount 170 may be formed of a semiconductor substrate such as AlN, BN, silicon carbon (SiC), GaN, GaAs or Si, but the disclosure is not limited thereto and may be formed of a semiconductor material having thermal properties.

When the submount 170 is made of Si, as exemplarily shown in FIG. 2, a protective layer (or, passivation layer) 160 may be further disposed between the first and second electrode pads 152 and 154, and the submount 170. Here, the protective layer 160 may be formed of an insulating material.

Although not shown, a first upper bump metal layer (not shown) may be further disposed between the first electrode layer 132 and the first bump 142, and a first lower bump metal layer (not shown) may be further disposed between the first bump 142 and the first electrode pad 152. Here, the first upper bump metal layer and the first lower bump metal layer function to mark a position at which the first bump 142 is disposed. Similarly, a second upper bump metal layer (not shown) may be further disposed between the second electrode layer 134A and the second bump 144, and a second lower bump metal layer (not shown) may be further disposed between the second electrode pad 154 and the second bump 144. Here, the second upper bump metal layer and the second lower bump metal layer function to mark a position at which the second bump 144 is disposed.

The first and second electrode pads 152 and 154, the protective layer 160 and the submount 170 are provided only for better understanding of the embodiments, but the following embodiments are not limited thereto.

The substrate 110 may have light transmittance so that light emitted from the active layer 124 is transmitted through the substrate 110. For example, the substrate 110 may be formed of at least one of sapphire (Al2O3), SiC, GaAs, GaN, ZnO, Si, GaP, InP and Ge, but the disclosure is not limited thereto. Also, the substrate 110 may have mechanical strength so that it can be efficiently separated into respective chips through scribing and breaking processes without causing an overall nitride semiconductor to bow.

The buffer layer 112 is disposed between the substrate 110 and the light emitting structure 120 to improve lattice mismatch between the substrate 110 and the light emitting structure 120. For example, the buffer layer 112 may contain AlN or undoped nitride, but the disclosure is not limited thereto. The buffer layer 112 may be omitted according to types of the substrate 110 and the light emitting structure 120. The buffer layer 112 may have a thickness of 2.2 μm to 4.2 μm for example, 3.2 μm.

The light emitting structure 120 is disposed under the buffer layer 112. The light emitting structure 120 may have a laminate structure including a first conductive type semiconductor layer 122, an active layer 124 and a second conductive type semiconductor layer 126 stacked in this order.

The first conductive type semiconductor layer 122 is disposed between the substrate 110 and the active layer 124 and is formed of a semiconductor compound. The first conductive type semiconductor layer 122 may be realized with a compound semiconductor containing Group III-V elements, Group II-VI elements or the like and may be doped with a first conductive type dopant. For example, the first conductive type semiconductor layer 122 is formed of a semiconductor material having a compositional formula of $Al_xIn_yGa_{1-x-y}N$ ($0 \leq x \leq 1$, $0 \leq y \leq 1$, $0 \leq x+y \leq 1$), or for example, at least one of InAlGaN, AlGaAs, GaP, GaAs, GaAsP, and AlGaInP. When the first conductive type semiconductor layer 122 is an n-type semiconductor layer, the first conductive type dopant may contain n-type dopant such as Si, Ge, Sn, Se, or Te. The first conductive type semiconductor layer 122 may have a single layer or multilayer structure, but the disclosure is not limited thereto. When the light emitting device 100A shown in FIG. 2 is an ultraviolet (UV), deep ultraviolet (deep UV) or non-polarized light emitting device, the first conductive type semiconductor layer 122 may contain at least one of InAlGaN and AlGaN. When the first conductive type semiconductor layer 122 is formed of AlGaN, a content of Al may be 50%. When the first conductive type semiconductor layer 122 is an n-type semiconductor layer, the first conductive type semiconductor layer 122 may be formed of Al0.5GaN and may have a thickness of 0.6 μm to 2.6 μm for example, 1.6 μm.

The active layer 124 may be disposed between the first conductive type semiconductor layer 122 and the second conductive type semiconductor layer 126 and may have a single well structure, double heterostructure, a multiple well structure, a single quantum well structure, a multi quantum well (MQW) structure, a quantum dot structure or a quantum wire structure. The active layer 124 may be formed to have a pair structure including a well layer and a barrier layer using a Group III-V compound semiconductor material, for example, at least one of InGaN/GaN, InGaN/InGaN, GaN/AlGaN, InAlGaN/GaN, GaAs(InGaAs)/AlGaAs, and GaP (InGaP)/AlGaP, but the disclosure is not limited thereto. The well layer may be formed of a material having a smaller energy band gap than an energy band gap of the barrier layer. In particular, the active layer 124 according to one embodiment may emit light with an ultraviolet or deep ultraviolet wavelength.

For example, the active layer 124 may have a MQW structure in which the number of pairs of the well layer and the barrier layer is five, a thickness of the well layer of each pair is 0.5 nm to 2.5 nm, for example, 1.5 nm and a thickness of the barrier layer is 7 nm to 17 nm, for example, 12 nm.

The second conductive type semiconductor layer 126 may be disposed under the active layer 124. The second conductive type semiconductor layer 126 may be formed of a semiconductor compound. The second conductive type semiconductor layer 126 may be realized with a compound semiconductor such as a Group III-V semiconductor, Group II-VI semiconductor or the like, and may be doped with a second conductive type dopant. For example, the second conductive type semiconductor layer 126 may be formed of a semiconductor material having a compositional formula of $In_xAl_yGa_{1-x-y}N$ ($0 \leq x \leq 1$, $0 \leq y \leq 1$, $0 \leq x+y \leq 1$), or at least one of AlInN, AlGaAs, GaP, GaAs, GaAsP, and AlGaInP. When the second conductive type semiconductor layer 126 is a p-type semiconductor layer, the second conductive type dopant may be a p-type dopant such as Mg, Zn, Ca, Sr or Ba. The second conductive type semiconductor layer 126 may have a single layer or multilayer structure, but the disclosure is not limited thereto. When the light emitting device 100A shown in FIG. 2 is an ultraviolet (UV), deep ultraviolet (deep UV) or non-polarized light emitting device, the second conductive type semiconductor layer 126 may contain at least one of InAlGaN and AlGaN. When the second conductive type semiconductor layer 126 is a p-type semiconductor layer, the second conductive type semiconductor layer 126 may contain graded AlGaN having an aluminum concentration gradient and have a thickness of 10 nm to 100 nm, thereby reducing lattice mismatching.

In addition, an electron blocking layer (EBL) 128 may further be optionally disposed between the active layer 124 and the second conductive type semiconductor layer 126. The electron blocking layer 128 may be formed of a nitride semiconductor having a larger energy band gap than that of the second conductive type semiconductor layer 126. When the electron blocking layer (EBL) 128 has a larger energy band gap than that of the second conductive type semiconductor layer 126, the electron blocking layer (EBL) 128 may effectively prevent a phenomenon in which electrons supplied from the first conductive type semiconductor layer 122 are not recombined in the active layer 124 of the MQW structure and overflow into the second conductive type semiconductor layer 126. The electron blocking layer 128 may for example contain at least one of GaN and InAlN. The electron blocking layer 128 formed of InAlN may have a thickness of 10 nm to 50 nm. When the second conductive type semiconductor layer 126 is formed of graded AlGaN, the electron blocking layer 128 may be omitted.

The electron blocking layer 128 may have an Al content higher than the barrier layer of the MQW 124. Accordingly, GaN may be not used for the electron blocking layer 128. When the electron blocking layer 128 contains AlGaN, an Al content of AlGaN may be at least 70% or more. For the deep ultraviolet (DUV) light emitting device, the well layer of the MQW 124 may have an Al content of about 35%, and the barrier layer of the MQW 124 may have an Al content of about 50%. In addition, the electron blocking layer 128 may be a p-type electron blocking layer. Namely, the electrons barrier layer 128 may be formed of p-type AlGaN.

Next, the first electrode layer 132 may contact the first conductive type semiconductor layer 122 and be formed of a metal. For example, the first electrode layer 132 may be formed of Ag, Ni, Al, Rh, Pd, Ir, Ru, Mg, Zn, Pt, Au, Hf or a combination thereof.

The first electrode layer 132 may be a transparent conductive oxide (TCO) film. For example, the first electrode layer 132 contains the afore-mentioned metal material and at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, and Ni/IrOx/Au/ITO, but the disclosure is not limited to these materials. The first electrode layer 132 may contain a material which ohmic-contacts the first conductive type semiconductor layer 122.

In addition, the first electrode layer 132 may have a single layer or multilayer structure using a reflective electrode material having ohmic properties. When the first electrode layer 132 functions as an ohmic layer, an additional ohmic layer (not shown) need not be formed.

Meanwhile, in an embodiment, the second electrode layer 134A extends in parallel to the active layer 124 and is disposed under the second conductive type semiconductor layer 126. The second electrode layer 134A has a larger energy band gap than that of the active layer 124. The reason for this is that when the energy band gap of the second electrode layer 134A is not larger than that of the active layer 124, light emitted from the active layer 124 may be absorbed in the second electrode layer 134A, instead of passing through or being reflected by the second electrode layer 134A.

The first conductive type semiconductor layer 122, the active layer 124 and the second conductive type semiconductor layer 126 in the light emitting structure 120 are disposed in a first direction on the substrate 110. In contrast, the second electrode layer 134A is disposed in a second direction different from the first direction on the second conductive type semiconductor layer 126.

The second electrode layer 134A may contain, for example, at least one of AlN and BN, but the disclosure is not limited thereto. Namely, the second electrode layer 134A may be formed using any material which reflects or transmits light emitted from the active layer 124 instead of absorbing the light, and is grown at a high quality on the second conductive type semiconductor layer 126.

In addition, generally, GaN has an energy band gap of 3.4 eV, AlN has an energy band gap of 6.02 eV and a MQW layer has an energy band gap of 4.4 eV. Accordingly, in the conventional light emitting device shown in FIG. 1, all light emitted from the MQW layer 24 are incident into and absorbed in the p-type GaN layer 28. However, when the second electrode layer 134A is formed of at least one material of AlN and BN, light emitted from the active layer 124 is not absorbed in the second electrode layer 134A, but is passed through the second electrode layer 134A or reflected thereby. As a result, light extraction efficiency is improved.

In addition, the second electrode layer 134A may function as the aforementioned electron blocking layer 128. In this case, the light emitting device 100A does not include the electron blocking layer 128.

In addition, the second electrode layer 134A contains an ohmic-contacting material and thereby functions as an ohmic layer, thus eliminating the necessity of separate ohmic layer (not shown). Alternatively, a separate ohmic layer (not shown) may be formed on the second electrode layer 134A.

In addition, the second electrode layer 134A may function as the second conductive type semiconductor layer 126. In this case, the second conductive type semiconductor layer 126 is omitted and the second electrode layer 134A may be disposed under the active layer 124. Namely, the second electrode layer 134A may be disposed in a region, in which the second conductive type semiconductor layer 126 is disposed, as shown in FIG. 2. As such, the second conductive type semiconductor layer 126 and the second electrode layer 134A as shown in FIG. 2 may have an integrated single layer structure.

In addition, when electric properties of the second electrode layer 134A are improved, injection of carriers (holes or electrons) through the second electrode layer 134A is facilitated.

In an embodiment, the thickness of the second electrode layer 134A may be reduced, thereby improving electric properties of the second electrode layer 134A. For example, the second electrode layer 134A may have a small thickness of 10 nm to 1,000 nm.

For example, when the light emitting device does not include the second conductive type semiconductor layer 126, the ohmic layer and the graded p-type AlGaN layer, the second electrode layer 134A may function as an electron blocking layer 128.

In another embodiment, the second electrode layer 134A is doped with a second conductive type dopant in an amount as high as possible, thereby improving electric properties of the second electrode layer 134A. For this purpose, a carrier concentration is increased by reducing activation energy of the second electrode layer 134A. In an embodiment, when the second electrode layer 134A is doped with at least one of oxygen ($O_2$) and carbon (C) in addition to the second conductive type dopant instead of being doped with only the second conductive type dopant, the activation energy of the second electrode layer 134A may be reduced, thereby increasing carrier concentration. Accordingly, the second electrode layer 134A may contain the second conductive type dopant and at least one of oxygen ($O_2$) and carbon (C). When the second conductive type is p-type, the second electrode layer 134A may contain a p-type dopant such as Mg, Zn, Ca, Sr, or Ba, and at least one of O2 and C.

In addition, generally, AlN has a refractive index of 2.12, GaN has a refractive index of 2.44, AlGaN has a refractive index of 2.12 to 2.44, BN has a refractive index of 1.728, and air has a refractive index of 1. In the conventional light emitting device shown in FIG. 1, a difference in refractive index between the p-type GaN layer 28 and air is 1.44. In the light emitting device shown in FIG. 2, a difference in refractive index between air and the second electrode layer 134A is 1.12 when the second electrode layer 134A is formed of AlN, and a difference in refractive index between air and the second electrode layer 134A is 0.728 when the second electrode layer 134A is formed of BN. The difference in refractive index between the second electrode layer 134A and air is preferably small so that light emitted from the active layer 124 can be incident upon the second electrode layer 134A and then easily escapes into air. Accordingly, unlike the conventional light emitting device, in the light emitting device 100A of the embodiment, more light escapes from the second electrode layer 134A into the air and light extraction efficiency is thus improved, since the difference in refractive index between the second electrode layer 134A and air is small.

In addition, generally, a refractive index of a material may be changed according to the composition of the material. Taking this fact into consideration, a content of the composition contained in the second conductive type semiconductor layer 126 and a content of the composition contained in the second electrode layer 134A may be determined, according to adjustment of a difference in refractive index between the second electrode layer 134A and the second conductive type semiconductor layer 126.

In order to enable light emitted from the active layer 124 to be easily reflected by the second electrode layer 134A, instead of passing through the second electrode layer 134A, the second electrode layer 134A and the second conductive type semiconductor layer 126 may have a content of composition determined to increase the difference in refractive index between the second electrode layer 134A and the second conductive type semiconductor layer 126.

Alternatively, so as to allow light emitted from the active layer 124 to be easily incident upon the second electrode layer 134A, instead of being reflected by the second electrode layer 134A, the second electrode layer 134A and the second conductive type semiconductor layer 126 may have a content of composition determined to decrease the difference in refractive index between the second electrode layer 134A and the second conductive type semiconductor layer 126.

For example, in a case in which the second conductive type semiconductor layer 126 and the second electrode layer 134A include an aluminum composition, when the content of aluminum present in the respective layers 126 and 134A is changed, a difference in refractive index between the second conductive type semiconductor layer 126 and the second electrode layer 134A is increased or decreased, and light emitted from the active layer 124 may be thus reflected by the second electrode layer 134A or passed through the second electrode layer 134A.

In the case of the afore-mentioned light emitting device 100A, the second electrode layer 134A reflects or transmits light emitted from the active layer 124, instead of absorbing the same, thus enabling all light to be emitted in upper and lower directions and improving luminous efficacy.

Meanwhile, in the light emitting device 100A shown in FIG. 2, the second electrode layer 134A is grown at a high quality on the second conductive type semiconductor layer 126 and optical properties of the second electrode layer 134A are thus improved by controlling a content of the composition of the second conductive type semiconductor layer 126. For this purpose, properties of the second conductive type semiconductor layer 126 will be described in detail.

In an embodiment, the second conductive type semiconductor layer 126 may be formed of a semiconductor material containing aluminum. For example, when the light emitting device 100A shown in FIG. 2 is an ultraviolet (UV), deep ultraviolet (deep UV) or non-polarized light emitting device, the second conductive type semiconductor layer 126 may be formed of AlzGaN as aforementioned. Here, Z represents a content of Al contained in the second conductive type semiconductor layer 126 and may be 50% to 100%.

In addition, aluminum contained in the second conductive type semiconductor layer 126 may have a concentration gradient which increases, as a distance from the active layer 124 increases. Namely, the second conductive type semiconductor layer 126 may be formed of graded-AlzGaN.

Figure 3A:
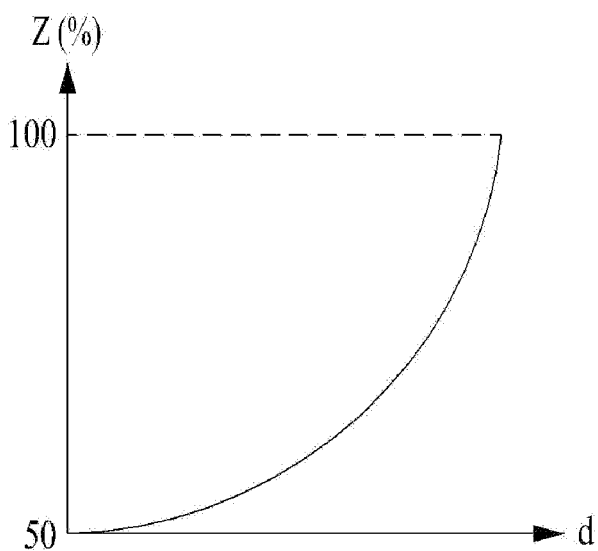
FIGS. 3A to 3C are graphs showing variation in content of aluminum in a second conductive type semiconductor layer as a function of distance from an active layer.
Figure 3B:
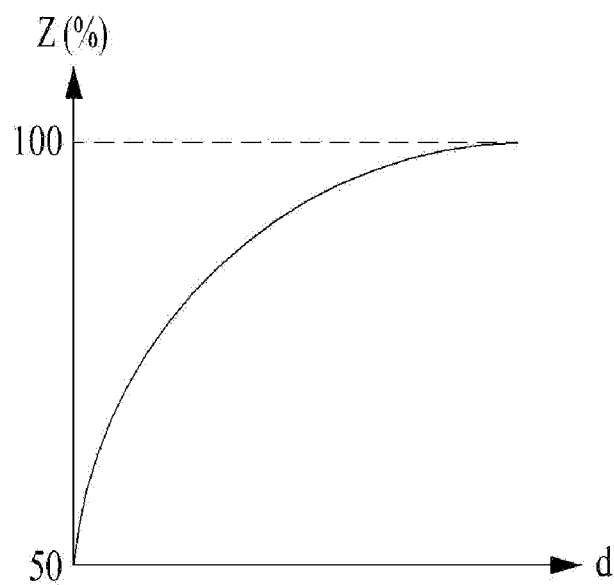
Figure 3C:
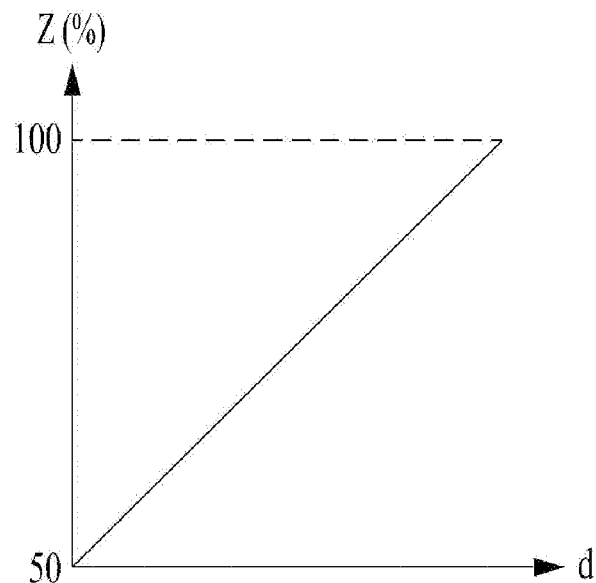

FIGS. 3A to 3C are graphs showing variation in content (Z) of aluminum present in the second conductive type semiconductor layer 126 as a function of a distance d from the active layer 124. Here, the electron blocking layer 128 is omitted and the distance d is zero at the interface between the active layer 124 and the second conductive type semiconductor layer 126.

As a distance from the active layer 124 increases, a concentration gradient of aluminum contained in the second conductive type semiconductor layer 126 may nonlinearly increase from 50% to 100%, as shown in FIG. 3A or 3B, or may linearly increase, as shown in FIG. 3C.

Figure 4A:
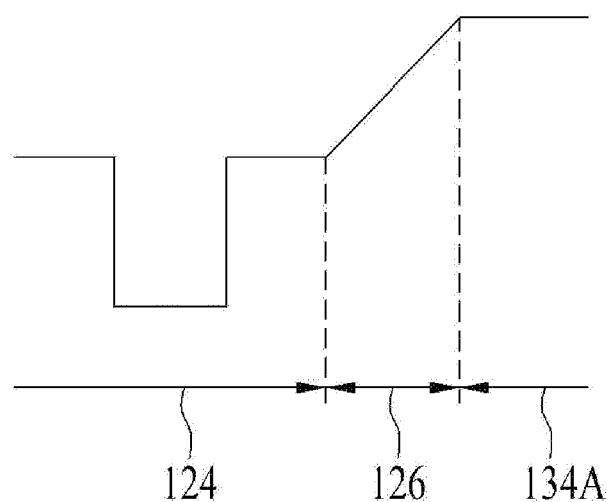
FIGS. 4A to 4C illustrate energy band diagrams of a conduction band of the light emitting device shown in FIG. 2.
Figure 4B:
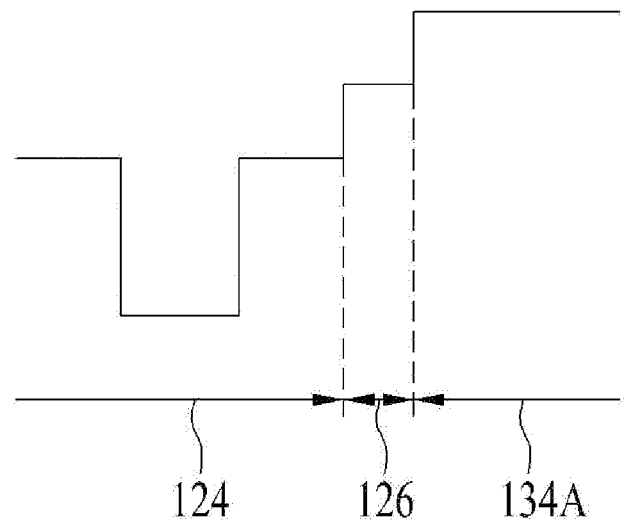
Figure 4C:
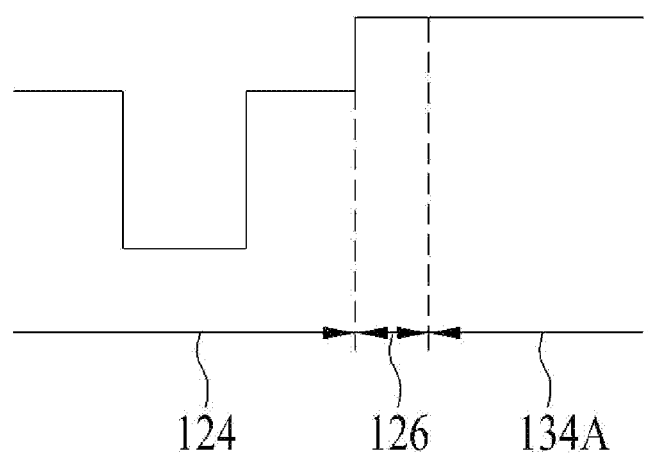

FIGS. 4A to 4C illustrate energy band diagrams of a conduction band of the light emitting device 100A shown in FIG. 2. Here, the electron blocking layer 128 is omitted.

The second conductive type semiconductor layer 126 may have a single layer or multilayer structure. When the second conductive type semiconductor layer 126 has a multilayer structure and is formed of graded-AlzGaN, an aluminum content ratio of the multilayer structure increases as a distance from the active layer 124 increases. However, when the second conductive type semiconductor layer 126 is a single layer structure, the second conductive type semiconductor layer 126 may be formed of graded-AlzGaN as shown in FIG. 4A or the second conductive type semiconductor layer 126 may be formed of AlzGaN as shown in FIG. 4B. In addition, when the second electrode layer 134A and the second conductive type semiconductor layer 126 form an integrated single layer structure, an energy band diagram is shown in FIG. 4C.

As shown in FIGS. 4A to 4C, since an energy band gap of the second electrode layer 134A is larger than an energy band gap of the active layer 124, a phenomenon in which electrons supplied from the first conductive type semiconductor layer 122 are not recombined with holes in the active layer 124 and overflow into the second conductive type semiconductor layer 126 may be effectively prevented, and holes of the second conductive type semiconductor layer 126 are easily injected into the active layer 124. As such, since the second electrode layer 134B may function as an electron blocking layer 128, the electron blocking layer 128 may be omitted.

In addition, the second conductive type semiconductor layer 126 may have a thickness of 10 nm to 100 nm.

Figure 5:
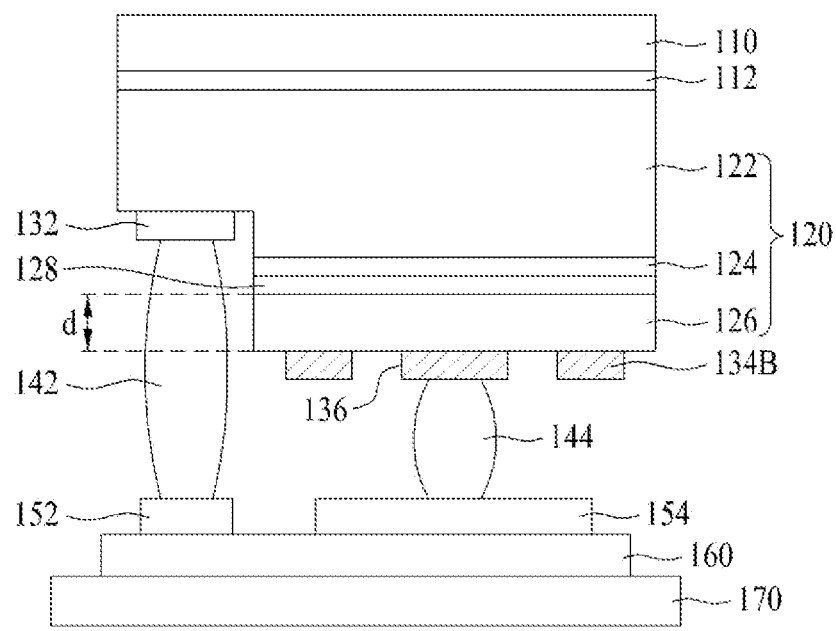
FIG. 5 is a sectional view illustrating a light emitting device according to another embodiment.

FIG. 5 is a sectional view illustrating a light emitting device 100B according to another embodiment.

In the present embodiment, the second electrode layer 134A of the light emitting device 100A shown in FIG. 2 does not have a pattern, while the second electrode layer 134B shown in FIG. 5 may have a light extraction pattern 136. As such, when the second electrode layer 134B has a light extraction pattern 136, light may be more efficiently transmitted or reflected. Aside from this point, the light emitting device 100B shown in FIG. 5 is the same as the light emitting device 100A shown in FIG. 2. Accordingly, like reference numerals are used throughout the drawings and a detailed explanation thereof is thus omitted.

The light extraction pattern 136 shown in FIG. 5 may have a variety of shapes as follows.

FIG. 6A to FIG. 6I are perspective views illustrating light extraction patterns 136A to 136I according to one embodiment. Here, the light extraction patterns 136A to 136I are embodiments of the light extraction pattern 136 shown in FIG. 5.

Figure 6A:
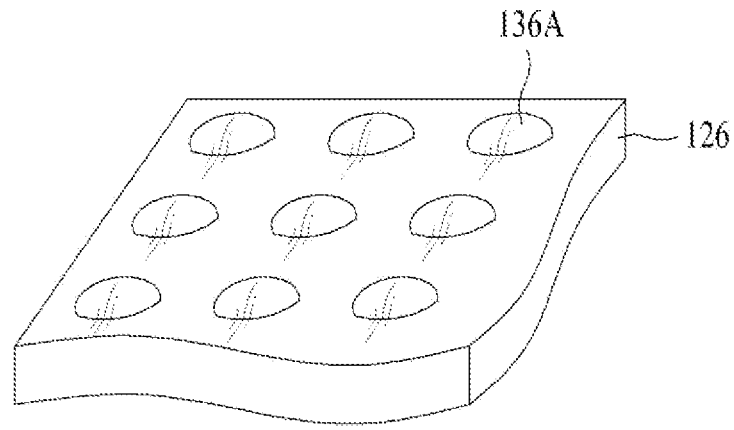
FIGS. 6A to 6I are perspective views illustrating light extraction patterns according to embodiments.
Figure 6B:
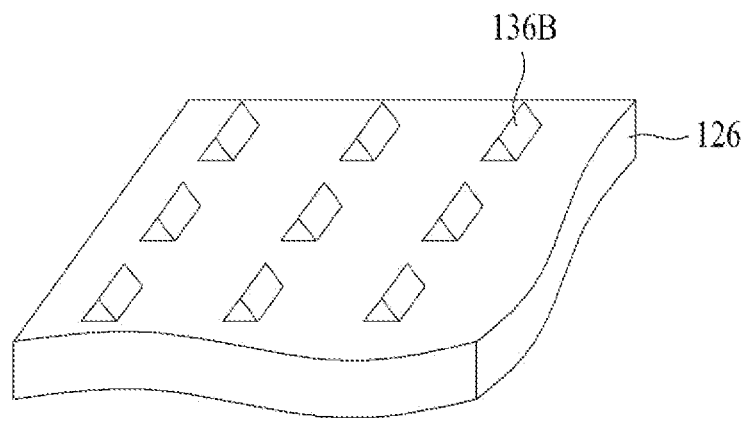
Figure 6C:
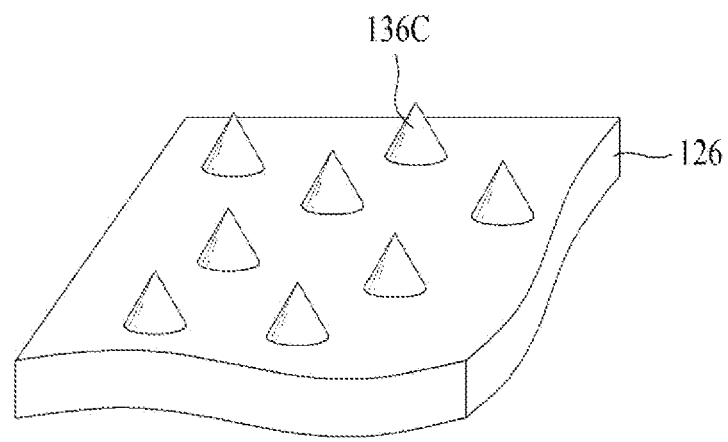
Figure 6D:
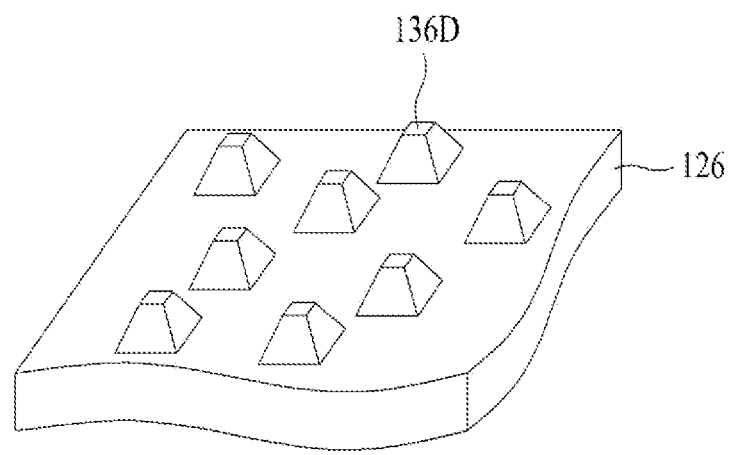
Figure 6E:
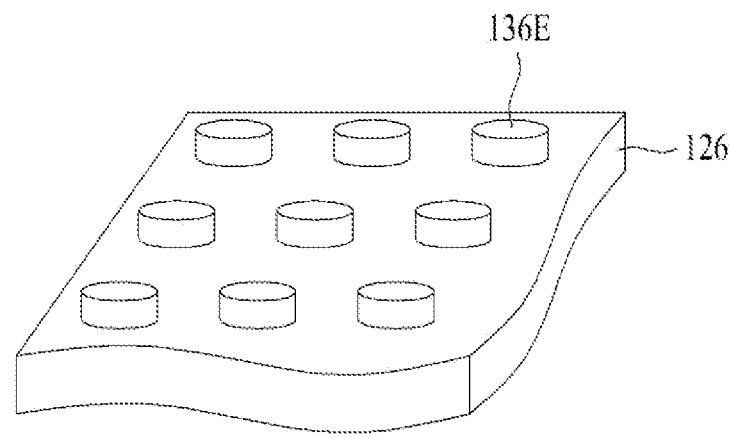
Figure 6F:
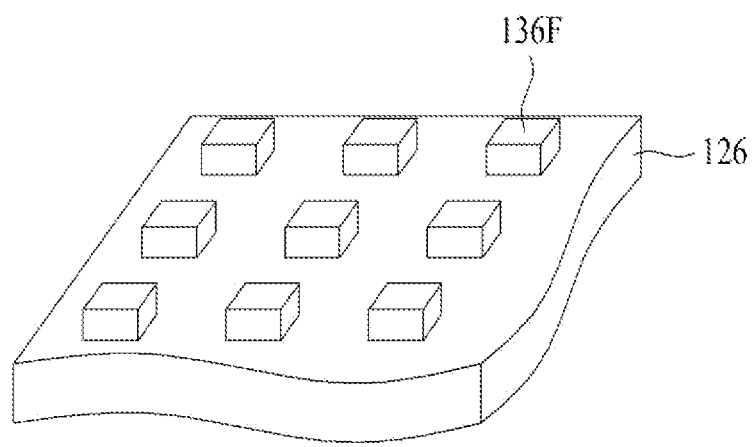
Figure 6G:
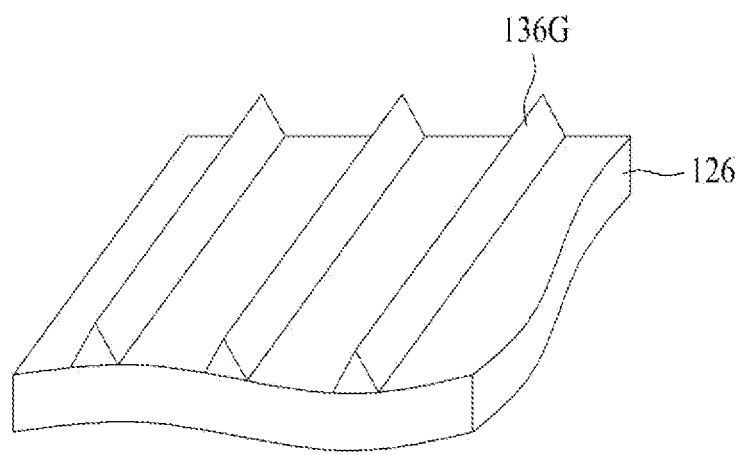
Figure 6H:
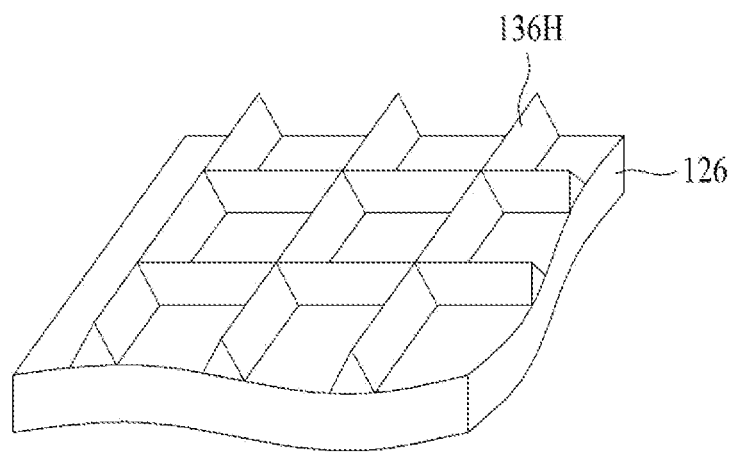

According to the embodiments, the light extraction pattern may be a hemispheral shape 136A, as shown in FIG. 6A, the light extraction pattern may be a secondary prism shape 136B as shown in FIG. 6B, the light extraction pattern may be a conic shape 136C, as shown in FIG. 6C, the light extraction pattern may be a truncated shape 136D, as shown in FIG. 6D, the light extraction pattern may be a cylindrical shape 136E, as shown in FIG. 6E, or the light extraction pattern may be a hexahedral shape 136F, as shown in FIG. 6F.

In addition, the light extraction pattern may have a bar shape. For example, the light extraction pattern shown in FIG. 6G has a secondary prism bar shape 136G, but the disclosure is not limited thereto. Alternatively, the light extraction pattern may have a hexahedral bar shape, a truncated bar shape or the like.

In addition, the light extraction pattern may have a lattice shape. For example, the light extraction pattern shown in FIG. 6H may have a secondary prism lattice shape 136H, but the disclosure is not limited thereto. Alternatively, the light extraction pattern may have a hexahedral lattice shape, a truncated lattice shape or the like.

Figure 6I:
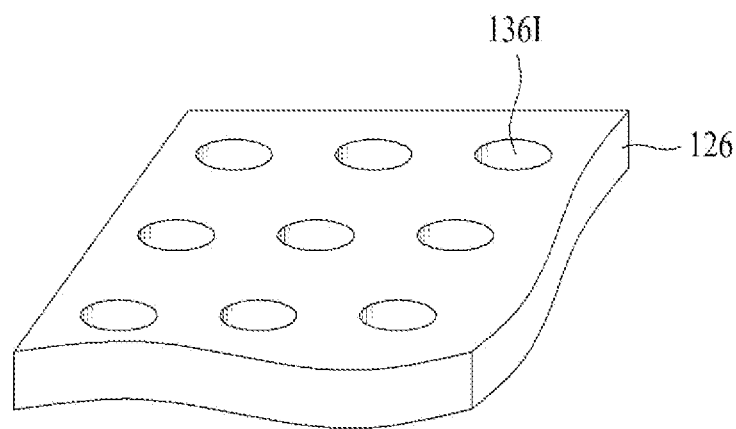

In addition, the light extraction patterns 136A to 136H shown in FIGS. 6A to 6H have a protrusion shape, but the light extraction pattern may have a groove shape. For example, as shown in FIG. 6I, the light extraction pattern may have a cylindrical groove shape 136I.

In addition, as shown in FIGS. 6A, 6B, and 6E to 6I, the light extraction patterns may be uniformly spaced from one another by a regular distance, and as shown in FIG. 6C or FIG. 6D, the light extraction patterns may be non-uniformly spaced from one another by an irregular distance.

Although not shown, the light extraction patterns may have a combination of two or more of the shapes shown in FIGS. 6A to 6I.

Meanwhile, the light emitting devices 100A and 100B shown in FIGS. 2 and 5 have a flip bonding structure, while in another embodiment, the light emitting devices 100C and 100D may have a horizontal type structure.

Figure 7:
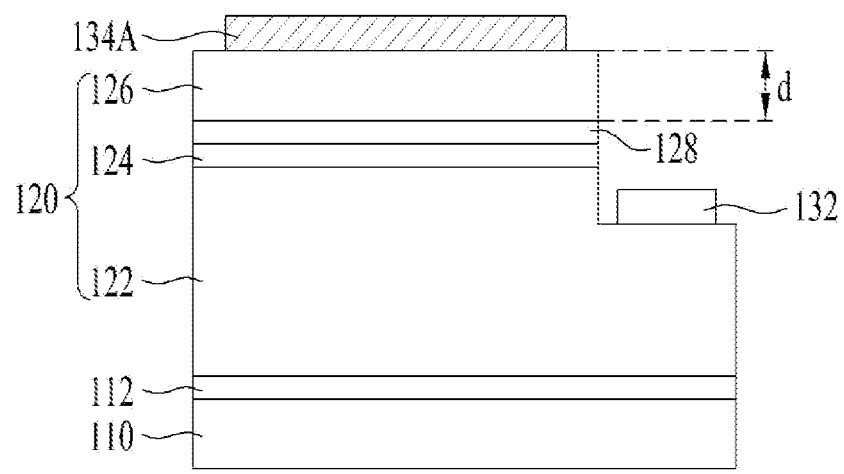
FIG. 7 is a sectional view illustrating a light emitting device according to another embodiment.
Figure 8:
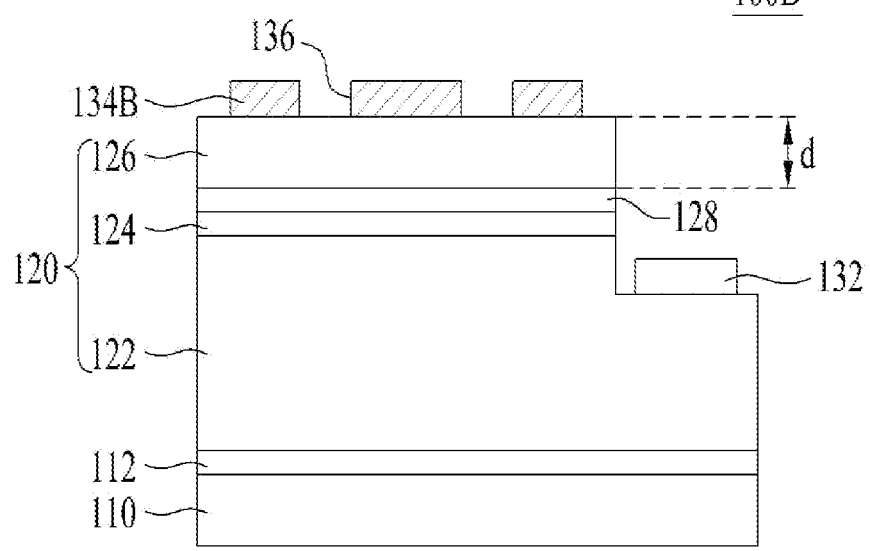
FIG. 8 is a sectional view illustrating a light emitting device according to another embodiment.

FIGS. 7 and 8 are sectional views illustrating light emitting devices 100C and 100D according to another embodiment.

The light emitting devices 100A and 100B shown in FIGS. 2 and 5 have a flip bonding structure in which light emitted from the active layer 124 is transmitted through the first conductive type semiconductor layer 122, the buffer layer 112 and the substrate 110. Accordingly, the first conductive type semiconductor layer 122, the buffer layer 112 and the substrate 110 may be formed of a light-transmitting material.

On the other hand, the light emitting devices 100C and 100D shown in FIGS. 7 and 8 have a horizontal type structures in which light emitted from the active layer 124 is transmitted through the second conductive type semiconductor layer 126 and the second electrode layer 134A. For this purpose, the second conductive type semiconductor layer 126 and the second electrode layer 134A shown in FIGS. 7 and 8 are formed of a light-transmitting material, the first conductive type semiconductor layer 122, the buffer layer 112 and the substrate 110 may be formed of a light transmitting or light non-transmitting material. In addition, since the light emitting devices 100C and 100D shown in FIGS. 7 and 8 have a horizontal type structure, not a flip chip bonding structure, the first and second bumps 142 and 144, the first and second electrode pads 152 and 154, the protective layer 160 and the submount 170 are unnecessary. Except for these differences, the light emitting devices 100C and 100D shown in FIGS. 7 and 8 are the same as the light emitting devices 100A and 100B shown in FIGS. 2 and 5. Accordingly, like reference numerals are used throughout the drawings and a detailed explanation thereof is thus omitted.

Hereinafter, a method for manufacturing the light emitting devices 100A, 100B, 100C and 100D shown in FIGS. 2, 5, 7 and 8 will be described in detail. The light emitting devices 100A to 100D may be manufactured by the method shown in FIGS. 9A to 9E as well as other methods.

FIGS. 9A to 9E are sectional views illustrating a method for manufacturing light emitting devices 100A to 100D according to the embodiments.

Figure 9A:
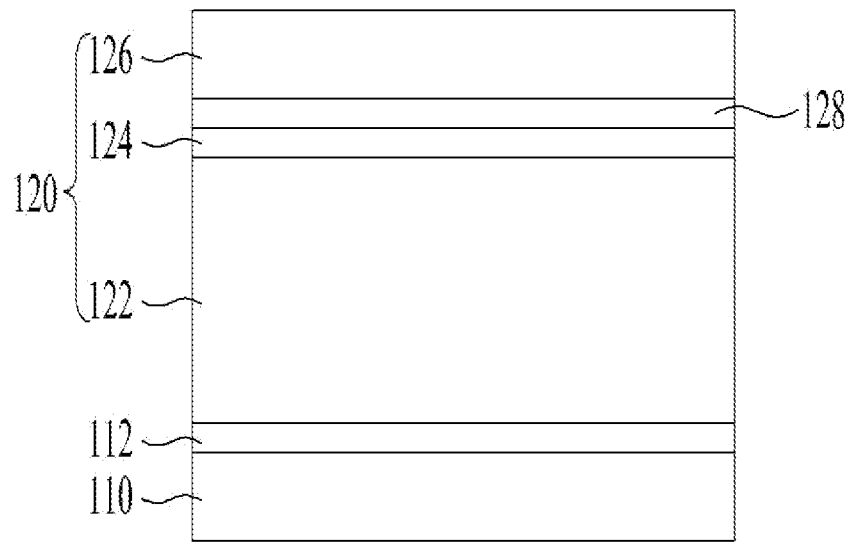
FIGS. 9A to 9E are sectional views illustrating a method for manufacturing the light emitting device according to the embodiments.

Referring to FIG. 9A, a buffer layer 112 is formed on a substrate 110.

The substrate 110 may be formed of at least one of sapphire (Al2O3), SiC, GaAs, GaN, ZnO, Si, GaP, InP and Ge, but the disclosure is not limited thereto. The substrate 110 for manufacturing the light emitting devices 100A and 100B shown in FIGS. 2 and 5 may be formed of a light-transmitting material, and the substrate 110 for manufacturing the light emitting devices 100C and 100D shown in FIGS. 7 and 8 may be formed of a light-transmitting or light-non-transmitting material.

In addition, the buffer layer 112 may be formed of AlN, but the disclosure is not limited thereto. The buffer layer 112 for manufacturing the light emitting devices 100A and 100B shown in FIGS. 2 and 5 may be formed of a light-transmitting material, but the buffer layer 112 for manufacturing the light emitting devices 100C and 100D shown in FIGS. 7 and 8 may be formed of a light-transmitting or light-non-transmitting material.

A light emitting structure 120 is grown on the buffer layer 112. The light emitting structure 120 may be formed by sequentially forming a first conductive type semiconductor layer 122, an active layer 124 and a second conductive type semiconductor layer 126 on the buffer layer 112. The light emitting structure 120 may be formed by a method such as metal organic chemical vapor deposition (MOCVD), chemical vapor deposition (CVD), plasma-enhanced chemical vapor deposition (PECVD), molecular beam epitaxy (MBE), or hydride vapor phase epitaxy (HYPE), but the disclosure is not limited thereto.

In the case of the light emitting devices 100A and 100B shown in FIGS. 2 and 5, the first conductive type semiconductor layer 122 may be formed of a light-transmitting material, but in the case of the light emitting devices 100C and 100D shown in FIGS. 7 and 8, the first conductive type semiconductor layer 122 may be formed of a light-transmitting or light-non-transmitting material.

An electron blocking layer (EBL) 128 may be optionally further formed between the active layer 124 and the second conductive type semiconductor layer 126. The electron blocking layer 128 may be grown using a method such as metal organic chemical vapor deposition (MOCVD) or molecular-beam epitaxy (MBE). When the electron blocking layer 128 is formed of InAlN, InAlN is commonly grown at a growth temperature of 780 to 880° C., at a low pressure of 200 mBar and less, and at a low growth velocity of 0.5 µm/h. InAlN need not be doped with a dopant, but may be doped with a p-type dopant such as Mg, Zn, Ca, Sr, or Ba. A doping level of InAlN may be suitably controlled, as necessary.

Figure 9B:
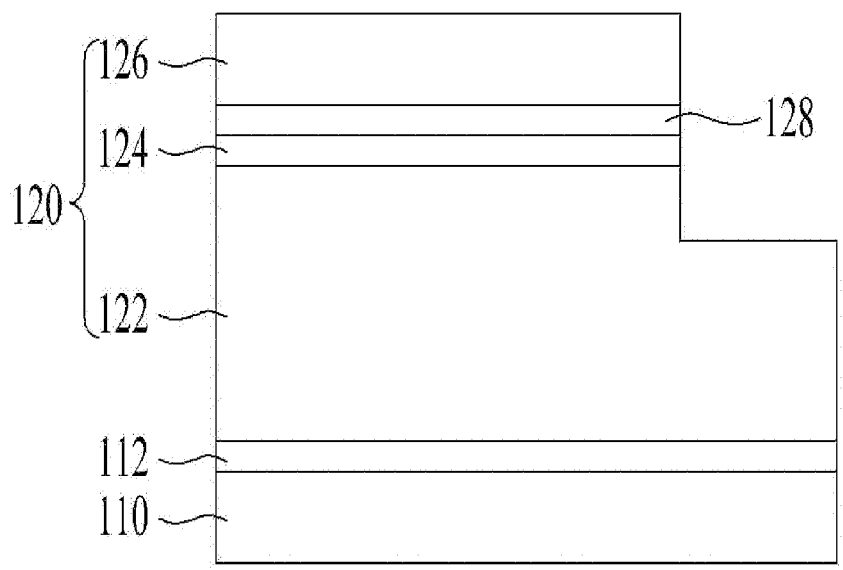

Next, referring to FIG. 9B, the first conductive type semiconductor layer 122, the active layer 124, the electron blocking layer 128 and the second conductive type semiconductor layer 126 are mesa-etched to expose the first conductive type semiconductor layer 122.

Figure 9C:
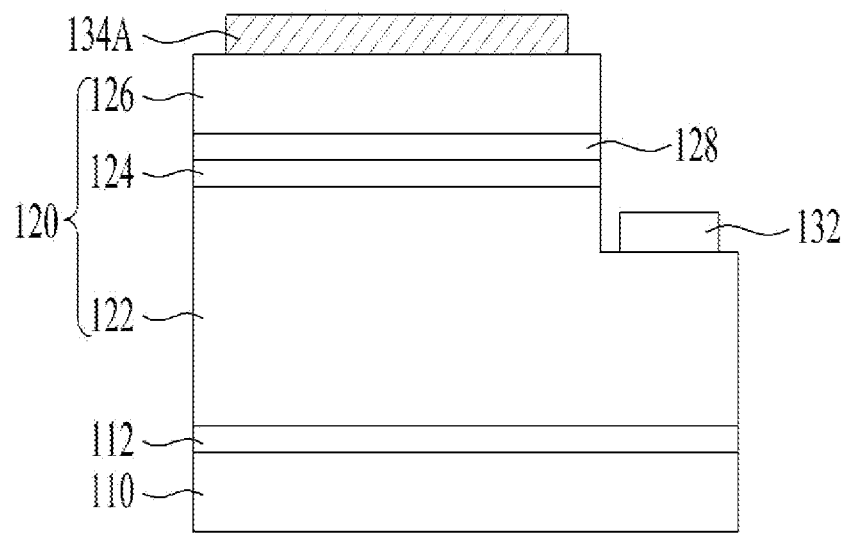

Next, referring to FIG. 9C, first and second electrode layers 132 and 134A are formed on the exposed first conductive type semiconductor layer 122 and the second conductive type semiconductor layer 126, respectively, to complete the light emitting device 100C shown in FIG. 7.

Figure 9D:
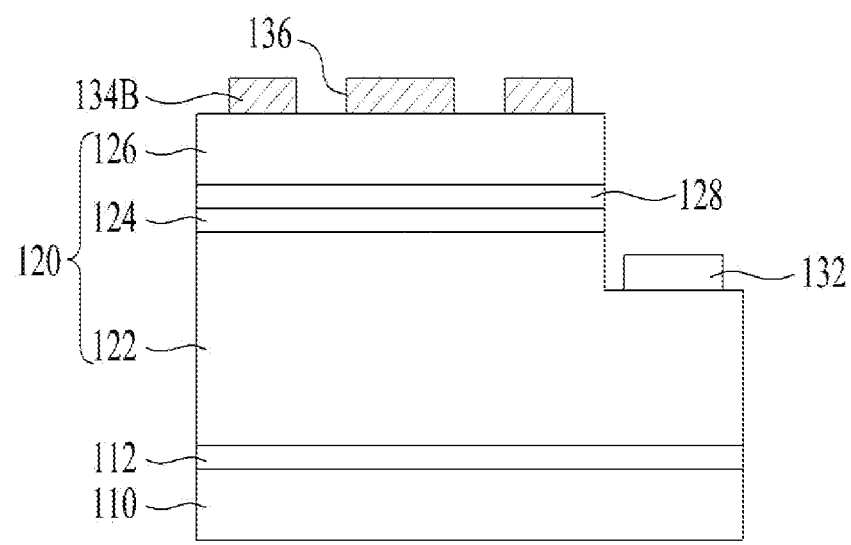

Next, referring to FIG. 9D, the second electrode layer 134A is patterned to form a light extraction structure 136 and thereby complete the light emitting device 100D shown in FIG. 8.

Alternatively, the manufacturing method shown in FIGS. 9A to 9C corresponds to a method for forming upper structures 110, 112, 122, 124, 128, 126 and 134A of the light emitting device 100A shown in FIG. 2, and the manufacturing method shown in FIGS. 9A to 9D corresponds to a method for forming upper structures 110, 112, 122, 124, 128, 126 and 134B of the light emitting device 100B shown in FIG. 5.

Figure 9E:
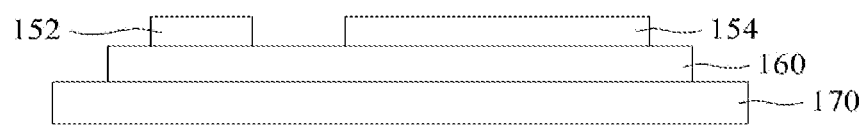

Referring to FIG. 9E, first and second electrode pads 152 and 154 are formed on the submount 170 by a separate process during the performance of the processes shown in FIGS. 9A to 9D. When the submount 170 is formed of Si, the protective layer 160 may be further formed on the submount 170 prior to formation of the first and second electrode pads 152 and 154. In this case, after the protective layer 160 is formed, the first and second electrode pads 152 and 154 are formed on the protective layer 160.

Meanwhile, the resulting structure shown in FIG. 9C or 9D is subjected to lapping and polishing processes. Next, the structure is rotated such that the substrate 110 is disposed on the top thereof and is bonded to the resulting structure shown in FIG. 9E. Then, as shown in FIG. 2 or 5, the first electrode layer 132 is bonded to the first electrode pad 152 through the first bump 142, and the second electrode layer 134A or 134B, is bonded to the second electrode pad 154 through the second bump 144.

Hereinafter, configuration and operation of a light emitting device package including the light emitting device 100A shown in FIG. 2 will be described in detail.

Figure 10:
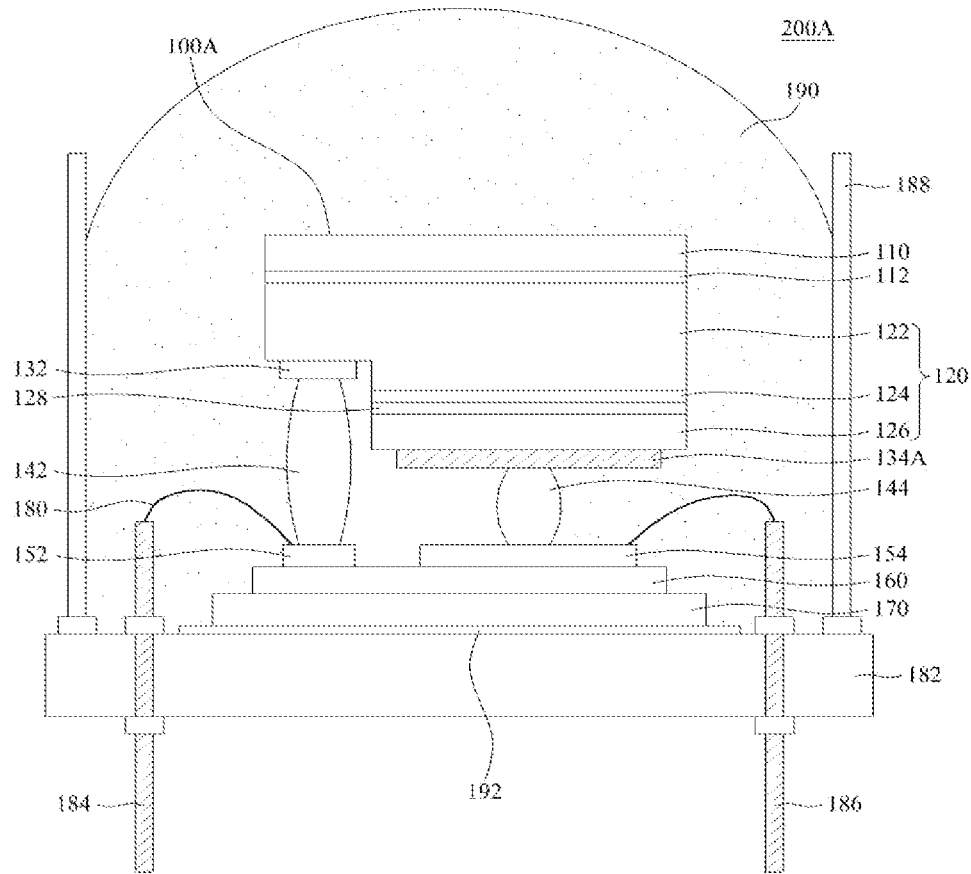
FIG. 10 is a sectional view illustrating a light emitting device package according to one embodiment.

FIG. 10 is a sectional view illustrating a light emitting device package 200A according to one embodiment.

The light emitting device package 200A according to one embodiment includes the light emitting device 100A, a wire 180, a header 182, a pair of lead wires 184 and 186, a side wall 188, a molding member 190 and an adhesion member 192. The light emitting device 100A is a light emitting device shown in FIG. 2. Accordingly, like reference numerals are used throughout the drawings and a detailed explanation thereof is thus omitted.

The submount 170 is connected through the adhesion member 192 to the header 182. The adhesion member 192 may employ a solder or paste type adhesive. The first and second electrode pads 152 and 154 of the light emitting device 100A are connected to the lead wires 184 and 186 through the wires 180, respectively. A power is supplied to the light emitting device 100A through the lead wires 184 and 186 which are electrically insulated from each other.

The molding member 190 fills a cavity of the package 200A formed by the side wall 188 and encompasses the light emitting device 100A to protect the same. In addition, the molding member 190 includes a phosphor and thereby changes a wavelength of light emitted from the light emitting device 100A.

Figure 11:
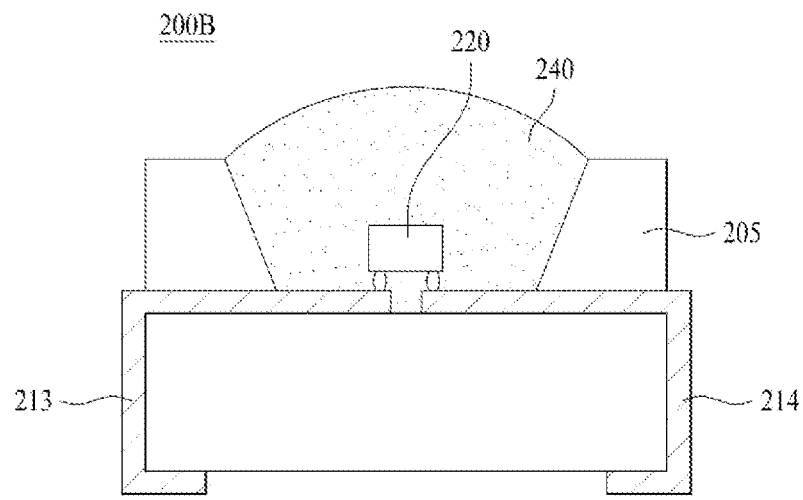
FIG. 11 is a sectional view illustrating a light emitting device package according to another embodiment.

FIG. 11 is a sectional view illustrating a light emitting device package 200B according to another embodiment.

The light emitting device package 200B according to another embodiment includes a package body 205, first and second lead frames 213 and 214 mounted in the package body 205, a light emitting device 220 disposed in the package body 205 and electrically connected to the first and second lead frames 213 and 214, and a molding member 240 encompassing the light emitting device 220.

The package body 205 may contain silicone, a synthetic resin or a metal and an inclined surface may be formed around the light emitting device 220.

The first and second lead frames 213 and 214 are electrically insulated from each other and function to supply power to the light emitting device 220. In addition, the first and second lead frames 213 and 214 function to reflect light emitted from the light emitting device 220 to increase luminous efficacy and discharge heat radiated from the light emitting device 220 to the outside.

The light emitting device 220 may be one of light emitting devices 100A to 100D shown in FIG. 2, 5, 7 or 8, but the disclosure is not limited thereto. Hereinafter, a case in which the light emitting device 220 is the light emitting device 100A or 100B shown in FIGS. 2 and 5 will be described in detail.

The light emitting device 220 may be disposed on the first or second lead frames 213 and 214 as shown in FIG. 11, or be disposed on the package body 205.

The light emitting device 220 is electrically connected to the first and/or second lead frames 213 and 214 by a flip chip method, but the disclosure is not limited thereto. Unlike the drawing, the light emitting device 220 may be electrically connected to the first and/or second lead frames 213 and 214 by one of wire and die bonding methods. The light emitting device 220 shown in FIG. 11 may be electrically connected to the first and second lead frames 213 and 214 by a bump, but the disclosure is not limited thereto.

The molding member 240 encompasses the light emitting device 220 to protect the same. In addition, the molding member 240 may include a phosphor to change a wavelength of light emitted from the light emitting device 220.

The light emitting element package according to the another embodiment includes a plurality of light emitting element packages arrayed on a substrate, and a light guide plate, a prism sheet, a diffusion sheet and the like as optical members may be arranged on a light passage of the light emitting element packages. The light emitting element package, the substrate and the optical member may serve as a backlight unit or a lighting unit. For example, lighting systems may include backlight units, light units, indicator devices, lamps and streetlamps and the like.

Figure 12:
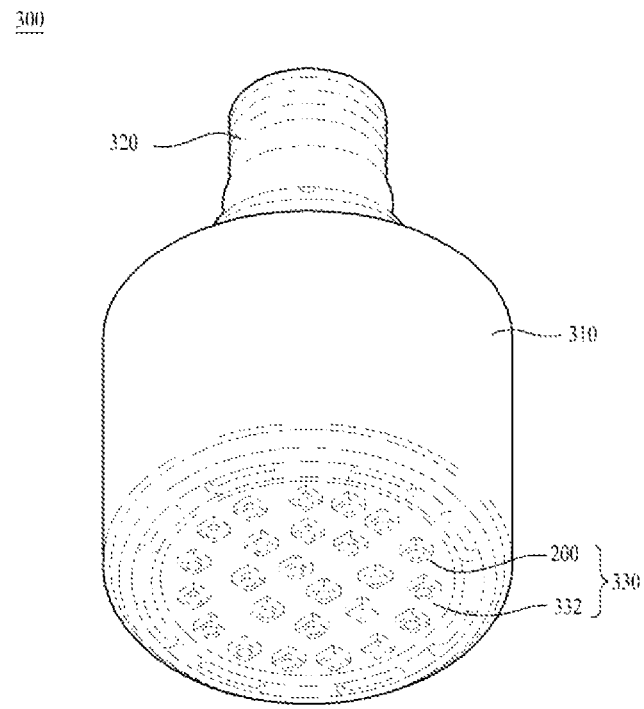
FIG. 12 is a perspective view illustrating a lighting unit according to one embodiment.

FIG. 12 is a perspective view illustrating a lighting unit 300 according to one embodiment. The lighting unit 300 of FIG. 12 is given as an example of the lighting system, but the disclosure is not limited thereto.

In the present embodiment, the lighting unit 300 includes a case body 310, a connection terminal 320 mounted in the case body 310 and receiving power from an exterior power supply, and a light emitting module unit 330 mounted in the case body 310.

The case body 310 is formed of a material having superior heat radiation property such as a metal or a resin.

The light emitting module unit 330 may include a substrate 332 and at least one light emitting device package 200 (200A or 200B) mounted on the substrate 332.

The substrate 332 may include a circuit pattern-printed insulator such as general printed circuit board (PCB), a metal core PCB, a flexible PCB or a ceramic PCB.

In addition, the substrate 332 may be formed of a material capable of efficiently reflecting light, or a surface color of the substrate 332 may be white or silver, etc., enabling efficient reflection of light.

At least one light emitting device package 200 (200A or 200B) may be mounted on the substrate 332. Each light emitting device package 200 (200A or 200B) may include at least one light emitting device 220, for example, a light emitting diode (LED). The light emitting diode may include a color light emitting diode emitting red, green, blue or white light, or a UV light emitting diode emitting ultraviolet (UV) light.

The light emitting module unit 330 may have an arrangement including a variety of combinations of the light emitting device package 200 (200A or 200B) in order to obtain desired color and brightness. For example, the light emitting module unit 330 may have a combination of a white light emitting diode, a red light emitting diode and a green light emitting diode in order to secure high color rendering index (CRI).

The connection terminal 320 is electrically connected to the light emitting module unit 330 to supply power. In the present embodiment, the connection terminal 320 is screwed and coupled to the exterior power supply, but the disclosure is not limited thereto. For example, the connection terminal 320 may be inserted as a pin shape into the exterior power supply or be connected to the exterior power supply via a wire.

Figure 13:
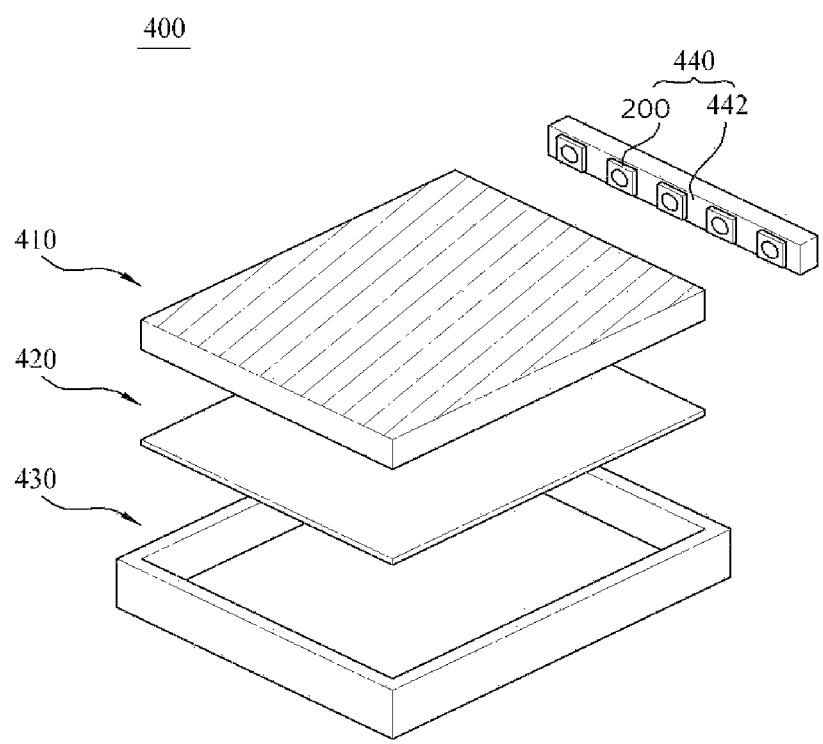
FIG. 13 is an exploded perspective view illustrating a backlight unit according to one embodiment.

FIG. 13 is an exploded perspective view illustrating a backlight unit 400 according to one embodiment. The backlight unit 400 of FIG. 13 is given as an example of the lighting system, but the disclosure is not limited thereto.

The backlight unit 400 according to the embodiment includes a light guide plate 410, a reflective member 420 disposed under the light guide plate 410, a bottom cover 430, and a light emitting module unit 440 to supply light to the light guide plate 410. The bottom cover 430 accommodates a light guide plate 410, a reflective member 420 and a light emitting module unit 440.

The light guide plate 410 functions to diffuse light and thereby realize surface illumination. The light guide plate 410 is formed of a transparent material, for example, an acrylic resin such as polymethyl methacrylate (PMMA), polyethylene terephthlate (PET), polycarbonate (PC), a cycloolefin copolymer (COC) or a polyethylene naphthalate (PEN) resin.

The light emitting module unit 440 supplies light to at least one side of the light guide plate 410 and functions ultimately as a light source of a display device on which a backlight unit is mounted.

The light emitting module unit 440 contacts the light guide plate 410, but the disclosure is not limited thereto. Specifically, the light emitting module unit 440 includes a substrate 442 and a plurality of light emitting device packages 200 mounted on the substrate 442. The substrate 442 may contact the light guide plate 410, but the disclosure is not limited thereto.

The substrate 442 may be a PCB including a circuit pattern (not shown). The substrate 442 may include not only a general PCB but also a metal core PCB (MCPCB), a flexible PCB or the like, but the disclosure is not limited thereto.

In addition, a plurality of the light emitting device packages 200 (200A and 200B) may be disposed on the substrate 442 such that a light-emitting surface emitting light is spaced from the light guide plate 410 by a predetermined distance.

The reflective member 420 may be formed under the light guide plate 410. The reflective member 420 reflects light incident upon the lower surface of the light guide plate 410 upwardly to improve brightness of the backlight unit. The reflective member 420 is formed of a PET, PC, PVC resin or the like, but the disclosure is not limited thereto.

The bottom cover 430 may accommodate the light guide plate 410, the light emitting module unit 440, the reflective member 420 and the like. For this purpose, the bottom cover 430 may have a box shape having an open top surface, but the disclosure is not limited thereto.

The bottom cover 430 may be formed of a metal or resin and be manufactured by a process such as press molding or extrusion molding.

The light emitting device according to the embodiment includes a second electrode layer having an energy band gap higher than an energy band gap of the active layer, thus enabling light emitted from the active layer to pass through the second electrode layer, instead of being absorbed in the second electrode layer, and thereby improving light extraction efficiency. Since a difference in refractive index between the second electrode layer containing AlN or BN and air according to the embodiment is smaller than a difference in refractive index between a p-type GaN layer and air in the conventional light emitting device structure, more light can escape from the second electrode layer to the air in the case of the embodiment of the present invention and light extraction efficiency can thus be improved, as compared to the conventional light emitting device structure. The second electrode layer has an energy band gap wider than an energy band gap of the active layer, thus serving as an electron blocking layer and eliminating the necessity of a separate electron blocking layer. The second electrode layer serves as a second conductive type semiconductor layer, thus eliminating the necessity of a second conductive type semiconductor layer. The second electrode layer contains at least one of oxygen (O2) and carbon (C) doped together with a doped second conductive type dopant, thus having a low active energy, increasing carrier concentration and thereby more and more improving electric properties of the second electrode layer. The second electrode layer has a small thickness of 10 nm to 1,000 nm, thus improving electric properties of the second electrode layer. The second electrode layer and the second conductive type semiconductor layer include a content of composition determined by a difference in refractive index between the second electrode layer and the second conductive type semiconductor layer, thus enabling light emitted from the active layer to be easily reflected by or transmitted from the second electrode layer and thereby improving light extraction efficiency.

According to another embodiment of the present disclosure, when the light emitting device of the light emitting device package emits DUV light, the aforementioned light emitting device package 200A, 200B may be applied to a variety of sterilizers.

Figure 14:
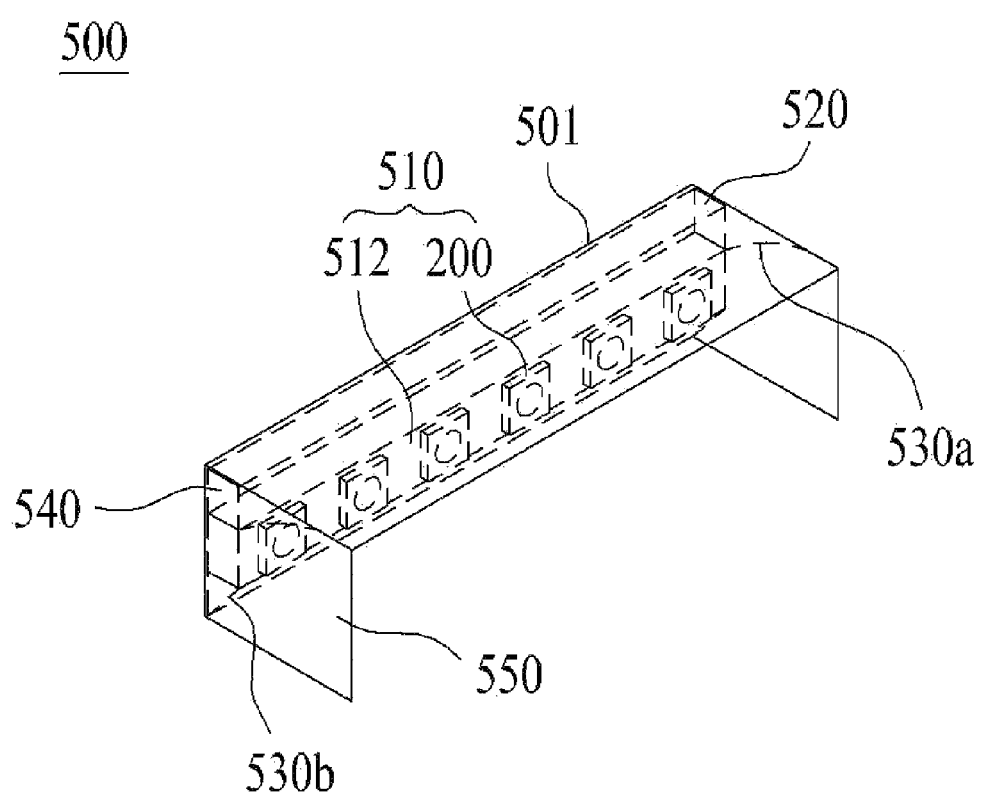
FIG. 14 is a perspective view illustrating an air sterilizer according to an embodiment of the present disclosure.

FIG. 14 is a perspective view illustrating an air sterilizer 500 according to an embodiment of the present disclosure.

Referring to FIG. 14, the air sterilizer 500 includes a light emitting module 510 mounted on one surface of a casing 501, diffuse reflection members 530a and 530b to diffusively reflect emitted DUV light, and a power supply 520 that supplies power required by the light emitting module 510.

First, the casing 501 may have a rectangular structure in which the light emitting module 510, the diffuse reflection members 530a and 530b, and the power supply 520 are integrally mounted, i.e., mounted in a compact structure. In addition, the casing 501 may be formed of a material and have a shape, for efficiently discharging heat generated by the sterilizer 500. For example, the material used to form the casing 501 may include at least one selected from the group consisting of Al, Cu, and any alloy thereof. Thus, the casing 501 may have improved heat transfer efficiency to the outside, thereby exhibiting improved heat dissipation.

Alternatively, the casing 501 may have a particular external surface shape. For example, the casing 501 may have an external surface shape such as a corrugated shape, a mesh shape, or an irregular uneven pattern. Thus, heat may be more efficiently transferred from the casing 501 to the outside, thereby improving heat dissipation.

Meanwhile, attachment plates 550 may further be disposed at both ends of the casing 501. The attachment plates 550 refer to brackets used to fix the casing 501 to the device as illustrated in FIG. 14. The attachment plates 550 may protrude from both ends of the casing 501 in a predetermined direction. In this regard, the predetermined direction is an inward direction of the casing 501 where DUV light is emitted and diffuse reflection occurs.

Thus, the attachment plates 550 disposed at both ends of the casing 501 provide fixing regions to the device to allow the casing 501 to be more efficiently fixed thereto.

The attachment plate 550 may have at least one shape selected from the group consisting of a screw coupling unit, a rivet coupling unit, an adhesive unit, and a detaching unit. In this regard, these various coupling units will be apparent to those skilled in the art, and thus a detailed description thereof will not be given herein.

Meanwhile, the light emitting module 510 is mounted on one surface of the casing 501. The light emitting module 510 emits DUV light to kill microorganisms in the air. To this end, the light emitting module 510 includes a substrate 512 and a plurality of light emitting device packages 100 mounted on the substrate 512. In this regard, each light emitting device package 200 corresponds to the light emitting device packages 200A and 200B, respectively, illustrated in FIGS. 10 and 11. Thus, each light emitting device package is designated by the same reference numerals.

The substrate 512 may be a PCB including a circuit pattern (not shown) aligned in a single column along an inner surface of the casing 501. The substrate 512 may also be a metal core PCB (MCPCB) or a flexible PCB in addition to general PCBs, but the present disclosure is not limited thereto.

The diffuse reflection members 530a and 530b refer to members having a reflection plate to cause diffuse reflection of DUV light emitted from the aforementioned light emitting module 510. The diffuse reflection members 530a and 530b may have various front shapes and may be aligned in various forms. By slightly modifying a planar structure, for example, radius of curvature, of the diffuse reflection members 530a and 530b, the diffuse reflected DUV light may overlap each other while being emitted so that emission intensity may be improved or a region exposed to the DUV light may have an enlarged width.

The power supply 520 receives power and supplies available power required by the light emitting module 510. The power supply 520 may be disposed in the casing 501. As illustrated in FIG. 14, the power supply 520 may be disposed at an inner wall of a space between the light emitting module 510 and each of the diffuse reflection members 530a and 530b. A power connector 540 to introduce external power to the power supply 520 may further be disposed.

As illustrated in FIG. 14, the power connector 540 may have a planar shape or may have a shape of a socket or a cable slot to which an external power cable (not shown) may be electrically connected. In addition, the power cable has a flexible extension structure so as to be efficiently connected to an external power supply.

Embodiments provide a light emitting device with improved light extraction efficiency.

In one embodiment, a light emitting device includes a substrate, a light emitting structure including a first conductive type semiconductor layer, an active layer and a second conductive type semiconductor layer disposed in a first direction on the substrate, a first electrode layer disposed on the first conductive type semiconductor layer, and a second electrode layer disposed in a second direction on the second conductive type semiconductor layer, the second electrode layer having an energy band gap wider than an energy band gap of the active layer.

The light emitting device may further include a submount, first and second electrode pads disposed on the submount, and first and second bumps to connect the first and second electrode layers to the first and second electrode pads, respectively.

At least one of the second conductive type semiconductor layer and the second electrode layer may include at least one material of AlN and BN.

The second electrode layer may include at least one of oxygen ($O_2$) and carbon (C), and a second conductive type dopant doped together therewith.

The second electrode layer may have a thickness of 10 nm to 1,000 nm.

A content of a composition included in the second electrode layer and the second conductive type semiconductor layer may be determined by a difference in refractive index between the second electrode layer and the second conductive type semiconductor layer. The composition may include aluminum. The content of the composition may be determined so as to increase a difference in refractive index between the second electrode layer and the second conductive type semiconductor layer. The content of the composition may be determined so as to decrease the difference in refractive index between the second electrode layer and the second conductive type semiconductor layer.

The second electrode layer may have a light extraction pattern. The light extraction pattern may have a secondary prism shape, a hemispheral shape, a conic shape, a truncated shape, a hexahedral shape, a cylindrical shape, a protrusion shape, a groove shape, a bar shape, a lattice shape or a combination thereof.

Light emitted from the active layer may be deep ultraviolet or ultraviolet light.

The second electrode layer and the second conductive type semiconductor layer may form an integrated single layer structure.

The second conductive type semiconductor layer may include a semiconductor material containing aluminum. Aluminum contained in the second conductive type semiconductor layer may have a concentration gradient which increases as a distance from the active layer increases. The concentration gradient may be nonlinear or linear. The aluminum may have a content of 50% to 100%.

The second conductive type semiconductor layer may have a thickness of 10 nm to 100 nm.

The second conductive type semiconductor layer may have a single layer or multilayer structure.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
a substrate;
a light emitting structure comprising a first conductive type semiconductor layer, an active layer, and a second conductive type semiconductor layer provided on the substrate;
a first electrode layer provided over the first conductive type semiconductor layer;
and
a second electrode layer provided over the second conductive type semiconductor layer, the second electrode layer having an energy band gap wider than an energy band gap of the active layer,
wherein the second electrode layer and the second conductive type semiconductor layer form an integrated single layer structure,
wherein an energy band gap of the second electrode layer is the same as an energy band gap of the second conductive type semiconductor layer,
wherein the second conductivity type semiconductor layer comprises a semiconductor material containing aluminum, and
wherein aluminum contained in the second conductive type semiconductor layer has a concentration gradient which increases as a distance from the active layer increases.

2. The light emitting device according to claim 1, further comprising:
a submount;
first and second electrode pads provided over the submount; and
first and second bumps to couple the first and second electrode layers to the first and second electrode pads, respectively.

3. The light emitting device according to claim 1, wherein the second electrode layer has a thickness of 10 nm to 1,000 nm.

4. The light emitting device according to claim 1, wherein the second electrode layer has a light extraction pattern.

5. The light emitting device according to claim 4, wherein the light extraction pattern has at least one of a secondary prism shape, a hemispheral shape, a conic shape, a truncated shape, a hexahedral shape, a cylindrical shape, a protrusion shape, groove shape, a bar shape, or a lattice shape.

6. The light emitting device according to claim 1, wherein light emitted from the active layer is deep ultraviolet or ultraviolet light.

7. The light emitting device according to claim 1, wherein the second electrode layer includes an ohmic-contacting material.

8. The light emitting device according to claim 1, wherein at least one of the second conductive type semiconductor layer and the second electrode layer comprises at least one material of AlN and BN.

9. The light emitting device according to claim 1, wherein the second electrode layer comprises at least one of oxygen ($O_2$) and carbon (C), and a second conductive type dopant doped together therewith.

10. The light emitting device according to claim 1, wherein the concentration gradient is nonlinear.

11. The light emitting device according to claim 1, wherein the concentration gradient is linear.

12. The light emitting device according to claim 1, wherein the aluminum has a content of 50% to 100%.

13. The light emitting device according to claim 1, wherein the second conductive type semiconductor layer has a thickness of 10 nm to 100 nm.

14. The light emitting device according to claim 1, wherein the second conductive type semiconductor layer has a single layer or multilayer structure.

15. The light emitting device according to claim 1, further comprising a separate ohmic layer disposed on the second electrode layer.

* * * * *